(12) United States Patent
Fukui et al.

(10) Patent No.: US 8,520,188 B2
(45) Date of Patent: Aug. 27, 2013

(54) ILLUMINATION APPARATUS FOR EFFICIENTLY GATHERING ILLUMINATION LIGHT

(75) Inventors: Tatsuo Fukui, Tokyo (JP); Masaki Kato, Yokohama (JP)

(73) Assignee: Nikon Corporation, Tokyo (JP)

( * ) Notice: Subject to any disclaimer, the term of this patent is extended or adjusted under 35 U.S.C. 154(b) by 234 days.

(21) Appl. No.: 12/805,213

(22) Filed: Jul. 19, 2010

(65) Prior Publication Data

US 2010/0283983 A1 Nov. 11, 2010

Related U.S. Application Data

(63) Continuation of application No. PCT/JP2009/050711, filed on Jan. 20, 2009.

(30) Foreign Application Priority Data

Jan. 21, 2008 (JP) ................................. 2008-010286

(51) Int. Cl.
*G03B 27/42* (2006.01)

(52) U.S. Cl.
USPC ............................................. 355/53; 355/67

(58) Field of Classification Search
USPC ..................................... 355/53, 67
See application file for complete search history.

(56) References Cited

U.S. PATENT DOCUMENTS

| | | | |
|---|---|---|---|
| 5,729,331 A | 3/1998 | Tanaka et al. | |
| 2003/0137644 A1 | 7/2003 | Tanaka et al. | |
| 2005/0012917 A1 | 1/2005 | Tanaka et al. | |
| 2005/0185162 A1 | 8/2005 | Tanaka et al. | |
| 2006/0238729 A1 | 10/2006 | Tanaka et al. | |
| 2007/0216885 A1 | 9/2007 | Tanaka et al. | |
| 2008/0192216 A1 | 8/2008 | Tanaka et al. | |
| 2008/0292259 A1* | 11/2008 | Cianciotto et al. | ............ 385/133 |

FOREIGN PATENT DOCUMENTS

| | | |
|---|---|---|
| JP | 7-57986 | 3/1995 |
| JP | 8-17223 | 1/1996 |
| JP | 2000-21712 | 1/2000 |
| JP | 2001-330964 | 11/2001 |
| JP | 2002-122996 | 4/2002 |
| JP | 2003-295459 | 10/2003 |
| JP | 2004-233749 | 8/2004 |
| JP | 2006-330441 | 7/2006 |
| JP | 2006-308983 | 11/2006 |
| JP | 2006-337475 | 12/2006 |

* cited by examiner

*Primary Examiner* — Toan Ton
*Assistant Examiner* — Mesfin T Asfaw

(57) ABSTRACT

An illumination apparatus includes a light guide fiber receiving illumination light, which is generated by first to third light sources, with first to third entrances and emitting at least part of the illumination light received by each entrance from a common exit. A second illumination relay optical system optically relays the illumination light from the second light source to form a first light beam having a first angle of incidence and sends the first light beam to the second entrance. First and third illumination relay optical systems optically relay the illumination light from the first and third light sources to form a second light beam having a second angle of incidence differing from the first angle of incidence and send the second light beam to the first and third entrances.

20 Claims, 6 Drawing Sheets

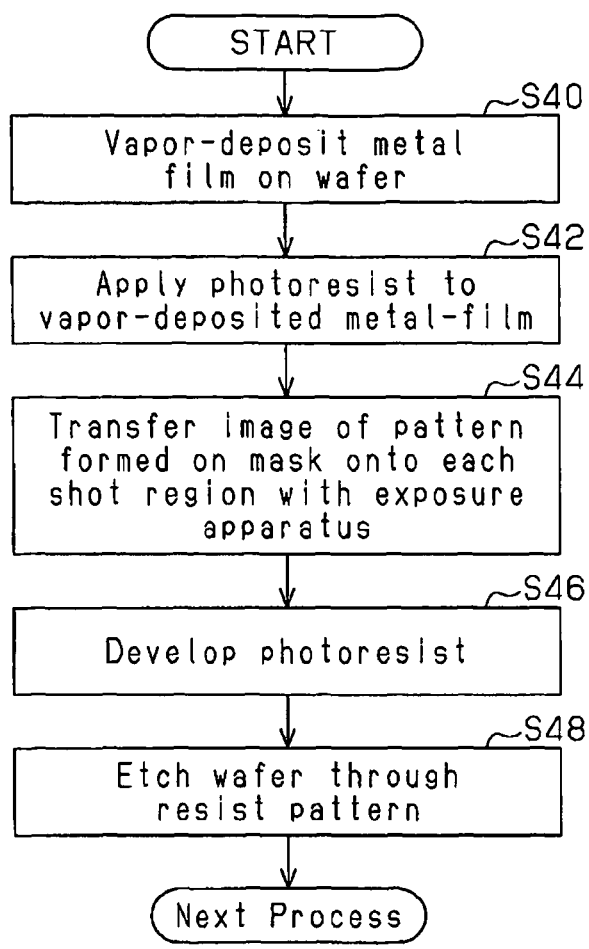
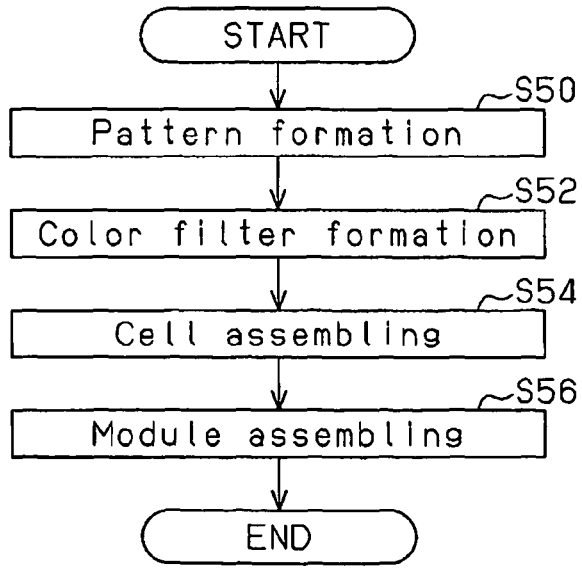

ILLUMINATION APPARATUS FOR EFFICIENTLY GATHERING ILLUMINATION LIGHT

CROSS-REFERENCE TO RELATED APPLICATIONS

This application is a continuing application, filed under 35 U.S.C. §111(a), of International Application PCT/JP2009/050711 filed on Jan. 20, 2009. This application is based upon and claims the benefit of priority from prior Japanese Patent Application No. 2008-10286, filed on Jan. 21, 2008, the entire contents of which are apparently incorporated herein by reference.

BACKGROUND

The present invention relates to an illumination apparatus for emitting illumination light received from a plurality of portions out of a common portion, an exposure apparatus, and an exposure method and device manufacturing method.

In the prior art, an exposure apparatus is used in a photolithography process to manufacture devices, such as a semiconductor element, a liquid crystal display element, and a thin film magnetic head. In a manufacturing process that uses the photolithography techniques, a projection optical system uses illumination light to illuminate and transfer a pattern, which is formed on a mask and serves as an original image, onto a plate to which a photosensitive agent such as photoresist is applied.

Due to the enlargement in the scale of liquid crystal elements or the like over these recent years, there is a demand for an exposure apparatus having an enlarged exposure region. Accordingly, a multi-lens exposure apparatus has been developed. The exposure apparatus transfers a pattern of a mask onto a plate, which is a photosensitive substrate, while synchronously moving the mask and the plate in a predetermined scanning direction relative to a plurality of projection optical units (for example, refer to Japanese Laid-Open Patent Publication No. 7-57986). The multi-lens exposure apparatus uses a plurality of light sources such as discharge lamps to ensure the exposure light intensity required for a large exposure region. The light from each light source is efficiently gathered by an elliptic mirror and used to illuminate the mask through, for example, an optical fiber bundle.

SUMMARY

When using an elliptic mirror to gather illumination light generated by the discharge lamps as exposure light, the illumination light entering the optical fiber bundle is the light in the gathered light beam of which the angle of incidence relative to the optical axis is in a small range. That is, the illumination light enters the optical fiber bundle in a state in which light in a low numerical aperture (NA) range does not exist (central part missing state). The illumination light entering one end of the optical fiber bundle is emitted from the other end of the optical fiber bundle at an angle of emergence that is equal to the angle of incidence during entrance. Thus, the pattern on the mask or like is illuminated by illumination light that is in a central part missing state. In this case, in comparison with when illuminated by a light beam uniformly filled with illumination light, the projected image of the pattern is more susceptible to aberration, which remains in the projection optical system, or the like. This may lower the accuracy for transferring the pattern onto the plate.

It is an object of the present invention to provide an illumination apparatus, an exposure apparatus, an exposure method, and a device manufacturing method that efficiently gathers illumination light generated by a light source and suppresses the occurrence of missing light in correspondence with the angle of incidence in the gathered light bundle when emitting illumination light.

An illumination apparatus according to the present invention includes a light source unit. A light transmission unit includes a plurality of entrances for receiving illumination light generated by the light source unit and a common exit for emitting at least part of the illumination light received by each entrance. A first relay optical system optically relays a first partial illumination light, which is included in the illumination light from the light source unit, to form a first light beam having a first angle of incidence and sends the first light beam into a first entrance, which is included in the plurality of entrances. A second relay optical system optically relays a second partial illumination light, which is included in the illumination light from the light source unit, to form a second light beam having a second angle of incidence that differs from the first angle of incidence and sends the second light beam into a second entrance, which is included in the plurality of entrances.

An exposure apparatus according to the present invention includes the aforementioned illumination apparatus and a projection optical system that forms a projected image of an object illuminated by the illumination light emitted from the illumination apparatus onto a photosensitive substrate.

An exposure method according to the present invention includes illuminating an object with the illumination light emitted from the aforementioned illumination apparatus and forming a projected image of the object illuminated with the illumination light on a photosensitive substrate.

A device manufacturing method according to the present invention includes illuminating an object with illumination light emitted from the aforementioned illumination apparatus to perform an exposure for transferring a projected image of the object onto a photosensitive substrate, developing the photosensitive substrate onto which the projected image has been transferred to generate on the photosensitive substrate a transfer pattern layer shaped in correspondence with the projected image, and processing the photosensitive substrate through the transfer pattern layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

FIG. 9 is a flowchart showing a method for manufacturing a semiconductor device according to the present embodiment; and FIG. 10 is a flowchart showing a method for manufacturing a liquid crystal device according to the present embodiment.

DETAILED DESCRIPTION OF THE EMBODIMENTS

Figure 1:
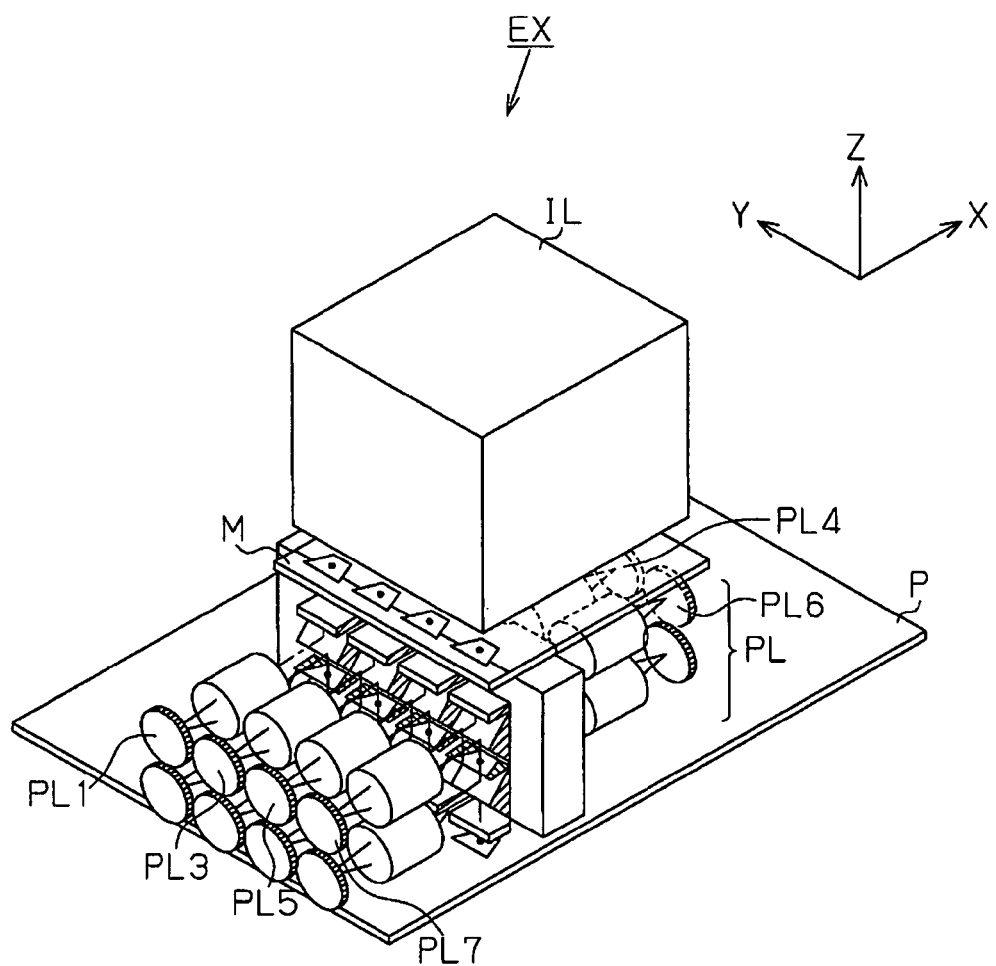
FIG. 1 is a schematic perspective view showing the structure of an exposure apparatus according to a first embodiment.

An illumination apparatus, an exposure apparatus, an exposure method, and a device manufacturing method according to one embodiment of the present invention will now be discussed with referent to the drawings. FIG. 1 is a perspective view showing the entire structure of an exposure apparatus EX according to a first embodiment of the present invention. The present embodiment will now be discussed using an example of a step and scan exposure apparatus that transfers a projected image of a pattern, which is formed on a mask M, onto a plate P (photosensitive substrate), while synchronously moving the mask M and the plate P relative to a projection optical system PL, which is formed by a plurality of catadioptric partial projection optical systems.

In the description hereafter, the positional relationship of each member will be described with reference to an XYZ orthogonal system set as shown in FIG. 1. The XYZ orthogonal system is set so that the X axis and Y axis are parallel to the plate P, and the Z axis extends in a direction perpendicular to the plate P. In the illustrated XYZ orthogonal coordinate system, the XY plane is actually set to be a plane that is parallel to a horizontal plate, and the Z axis is set in a vertical direction. Further, in this embodiment, the moving direction (scanning direction) of the mask M and the plate P is set as the X axis direction.

Figure 2:
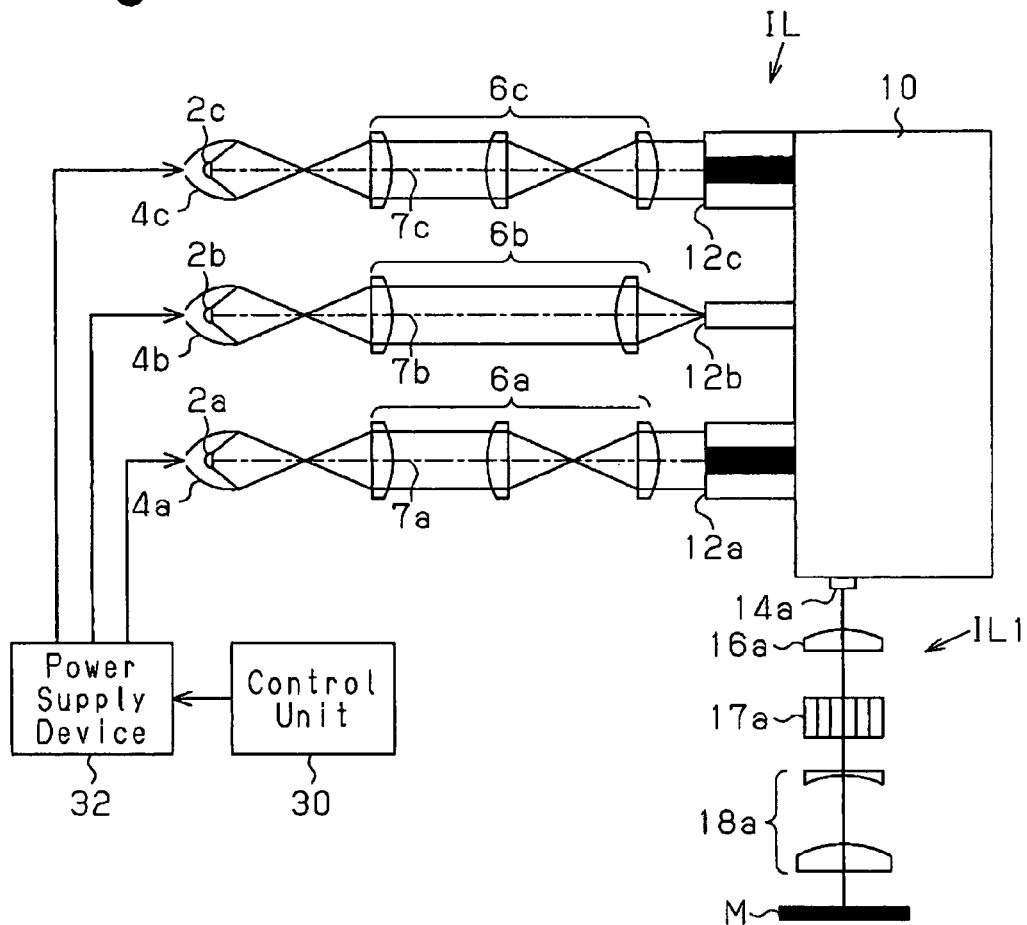
FIG. 2 is a diagram showing the structure of an illumination apparatus according to the first embodiment.

The exposure apparatus EX includes an illumination apparatus IL that mixes the illumination light from a plurality of light sources to uniformly illuminate the mask M, which is supported on a mask stage (not shown). Referring to FIG. 2, the illumination apparatus IL includes three light sources 2a, 2b, and 2c, which are formed by discharge lamps such as ultrahigh pressure mercury lamps. Illumination light emitted from the light source 2a is gathered by an elliptic mirror 4a and then gathered at an entrance 12a of a light guide fiber 10 by an illumination relay optical system 6a. Further, the illumination light emitted from the light source 2b is gathered at an entrance 12b of the light guide fiber 10 by an elliptic mirror 4b and an illumination relay optical system 6b. The illumination light emitted from the light source 2c is gathered at an entrance 12c of the light guide fiber 10 by an elliptic mirror 4c and an illumination relay optical system 6c. The light source 2a and the elliptic mirror 4a, the light source 2b and the elliptic mirror 4b, and the light source 2c and the elliptic mirror 4c form a light source unit, respectively. The elliptic mirrors 4a, 4b, and 4c function as a light emitting image formation unit and have first focal points in the vicinity of the light sources 2a, 2b, and 2c, which serve as light emitting units.

The light guide fiber 10 (light transmission unit) is a random light guide fiber, which is formed by randomly bundling a large number of optical fiber strands at the entrance side and the exit side, and includes the three entrances 12a, 12b, and 12c and seven exits (FIG. 2 shows only exit 14a). The light guide fiber 10 equally distributes the optical fiber strands bundled at the entrances 12a to 12c to the seven exits. The illumination light entering each of the entrances 12a to 12c is equally divided to the seven entrances and emitted therefrom. That is, the light guide fiber 10 emits at least part of the illumination light received through each of the entrances 12a to 12c from a common exit. The illumination light emitted from each of the seven exits enters a partial illumination light optical system IL1, which partially illuminates the mask M, and six partial illumination optical systems IL2 to IL7, which are not shown in the drawings.

In the partial illumination optical system IL1, the illumination light emitted from the exit 14a of the light guide fiber 10 is transformed to a collimated light beam by a collimating lens 16a and then enters a fly's eye lens 17a, which is an optical integrator. The illumination light entering the fly's eye lens 17a undergoes wavefront splitting, which is performed by a plurality of lens elements that form the fly's eye lens 17a, and then forms a secondary light source (planar light source), which includes the same number of light sources as the lens elements, at a back focal plane (vicinity of exit plane). The illumination light from the plurality of secondary light sources formed at the back focal plane of the fly's eye lens 17a illuminates part (partial illumination region) of the mask M with a condenser lens 18a in a substantially uniform manner. The partial illumination optical systems IL2 to IL7 (not shown) each have the same structure as the partial illumination optical system IL1. Further, the partial illumination optical systems IL2 to IL7 illuminate the corresponding partial illumination regions on the mask in a substantially uniform manner in the same manner as the partial illumination optical system IL1.

Figure 3:
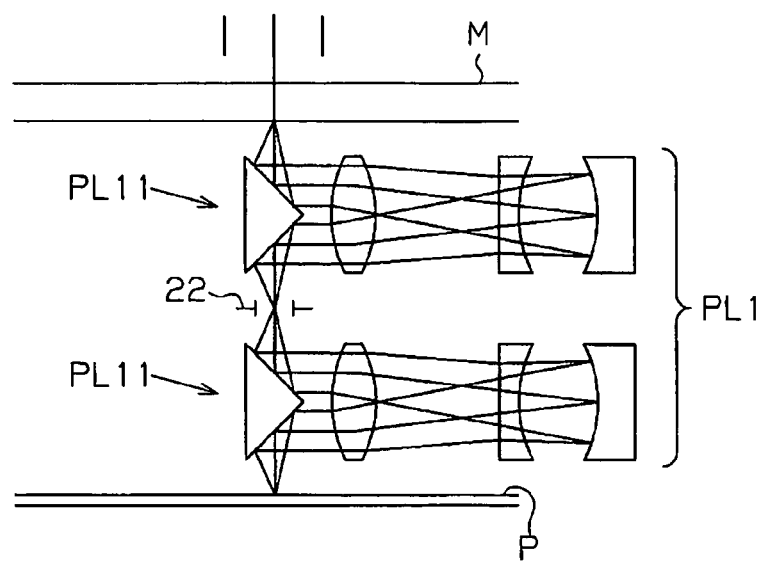
FIG. 3 is a diagram showing the structure of a partial projection optical system according to the first embodiment.

Among a plurality of partial projection optical systems PL1 to PL7 (PL2 not shown in FIG. 1) laid out in correspondence with the partial illumination regions, the illumination light from the partial illumination region corresponding to the partial illumination optical system IL1 enters the partial projection optical system PL1. The partial projection optical systems PL1 to PL7 form on the plate P a projection image of the pattern on the mask M in the corresponding partial illumination region. FIG. 3 is a diagram showing the structure of the partial projection optical system PL1. As shown in FIG. 3, the partial projection optical system PL1 includes a first catadioptric partial projection optical system PL11, which forms an intermediate image of the pattern of the partial illumination region in a field stop 22, and a second catadioptric partial projection optical system PL12, which forms a projection image (unit magnification erect image) of the pattern in the partial illumination region on the plate P.

In the same manner, the illumination light passing through each of the partial illumination optical systems IL2 to IL7 enters the partial projection optical systems PL2 to PL7, which are arranged in correspondence with the partial illumination light optical systems IL2 to IL7. The partial projection optical systems PL2 to PL7 each have the same structure as the partial projection optical system and forms on the plate P the projection image of the pattern in the corresponding partial illumination region. The partial projection optical systems PL1 to PL7 are arranged zigzagged in the Y direction so that the partial projection optical systems PL2, PL4, and PL6 are respectively arranged between the partial projection optical systems PL1, PL3, PL5, and PL7. The partial illumination optical systems IL1 to IL7 are also arranged zigzagged in the Y direction in correspondence with the layout of the partial projection optical systems PL1 to PL7.

Figure 4A:
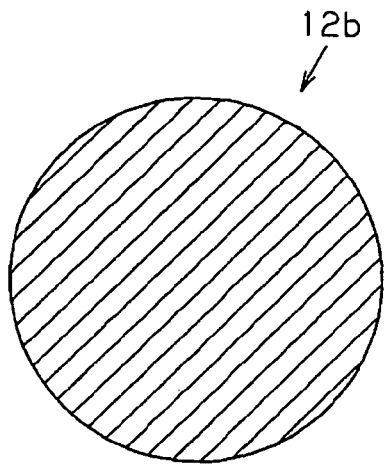
FIG. 4 is a diagram showing the structure of an entrance of a light guide fiber according to the first embodiment.
Figure 4B:
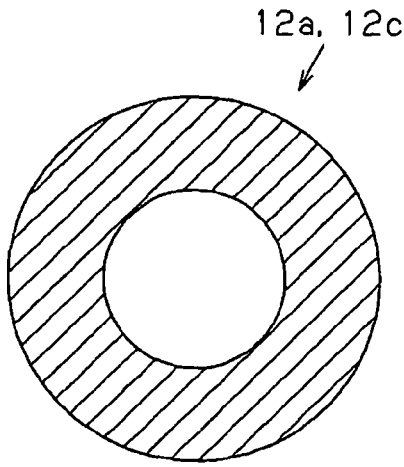

In an illumination apparatus IL according to the present embodiment, the entrance 12b arranged in correspondence with the light source 2b is formed by bundling a plurality of optical fibers (optical fiber bundle) into a round shape as shown in FIG. 4A. Further, the entrances 12a and 12c arranged in correspondence with the light sources 2a and 2c are formed by bundling a plurality of optical fibers (optical fiber bundle) into an annular shape as shown in FIG. 4B. In other words, the entrances 12a and 12c are each formed by an optical fiber bundle that is missing a central part.

Figure 5:
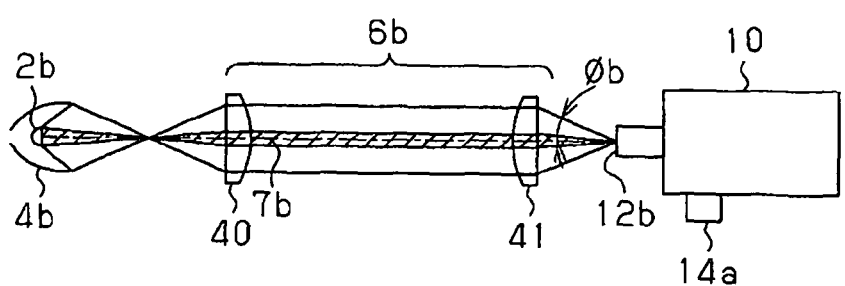
FIG. 5 is a diagram showing the structure of part of the illumination apparatus according to the first embodiment.

Referring to FIG. 5, the illumination relay optical system 6b (first relay optical system), which includes a collimating lens 40 and a collecting lens 41, optically relays illumination light (first partial illumination light) from the light source 2b to the entrance 12b (first entrance) as a first light beam having an incident angle φb. In this state, the illumination relay optical system 6b projects the image of the light source 2b, which functions as a light emitting unit, into the entrance 12b. Here, the illumination light from the light source 2b is efficiently gathered by the elliptic mirror 4b. Thus, the gathered light beam does not include light of which the angle of incidence (angle relative to the optical axis 7b of the illumination relay optical system 6b) is in a small range. That is, light in a low numerical aperture (NA) range (for example, the light in the range shown by diagonal lines in FIG. 5) does not exist in the gathered light beam (central part missing state). Further, the incident angle φb, which serves as a first angle of incidence, is an angle determined by the angle of divergence of the illumination light in the light source 2b and the relay magnification of the illumination relay optical system 6b.

Figure 6:
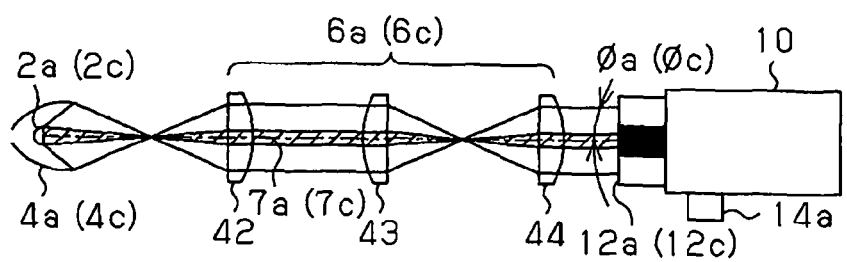
FIG. 6 is a diagram showing the structure of part of the illumination apparatus according to the first embodiment.

Referring to FIG. 6, the illumination relay optical systems 6a and 6c (second relay optical systems) each include a first collimating lens 42, a collecting lens 43, and a second collimating lens 44. Further, the illumination relay optical systems 6a and 6c optically relay illumination lights (second partial illumination lights) from the light sources 2a and 2c to the entrances 12a and 12c as second light beams having incident angles φa and φc, which serve as second angles of incidence that are smaller than the incident angle φb. In this state, the illumination relay optical systems 6a and 6c project Fourier transformation images corresponding to the light sources 2a and 2c, which serve as light emitting units, onto the entrances 12a and 12c that are arranged on the focal planes of the illumination relay optical systems 6a and 6c.

The illumination lights from the light sources 2a and 2c are also efficiently gathered by the elliptic mirrors 4a and 4c. Thus, the gathered light beams do not include light of which the angle of incidence (angles relative to the optical axes 7a and 7c of the illumination relay optical system 6a and 6c) is in a small range. That is, light in a low numerical aperture (NA) range (for example, the light in the range shown by diagonal lines in FIG. 6) does not exist in the gathered light beam (central part missing state). Further, the incident angles φa and φc, which serve as the second angles of incidence, are angles determined by the size of the light sources 2a and 2c and the focal distances of the illumination relay optical systems 6a and 6c. In the illumination relay optical systems 6a and 6c, the illumination lights, which are in a central part missing state, enter the annular entrances 12a and 12c shown in FIG. 4B. Thus, the illumination light from the light sources 2a and 2c efficiently enter the light guide fiber 10.

The incident angles φa to φc are angles corresponding to the numerical apertures of the illumination lights entering the entrances 12a to 12c, respectively. As shown in FIGS. 5 and 6, the incident angles φa to φc correspond to the maximum incident angles of the illumination lights gathered at the entrances 12a to 12c, respectively.

Figure 7A:
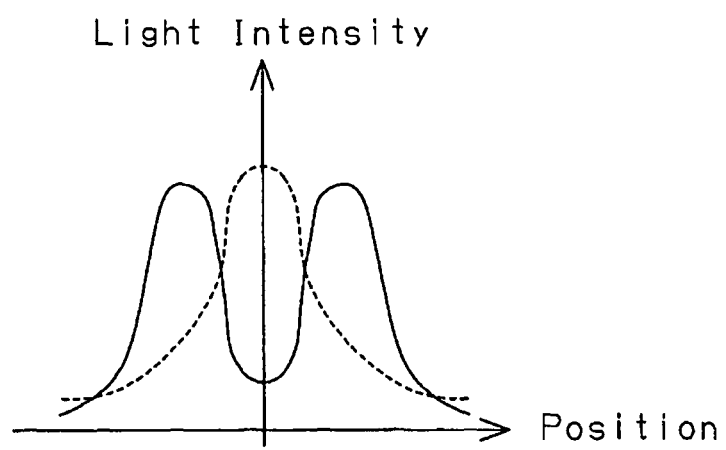
FIG. 7 is a chart showing the light intensity distribution at the entrance side of a fly eye's lens according to the first embodiment.

FIG. 7 is a chart showing the light intensity distribution of the illumination light emitted from the exit 14a of the light guide fiber 10 in the vicinity of the entrance side of the fly's eye lens 17a. The light intensity distribution shows the light intensity in a cross-section including the optical axis of the partial illumination optical system IL1 with respect to locations from the optical axis. When only the illumination light from the light source 2b relayed by the illumination relay optical system 6b enters the light guide fiber 10 from the entrance 12b, the light intensity distribution of the illumination light at the vicinity of the entrance side of the fly's eye lens 17a is such that the light intensity in the vicinity of the optical axis is less than the light intensity outside this portion as shown by the solid line in FIG. 7A. Thus, illumination characteristics similar to annular illumination are obtained. In contrast, when only the illumination lights from the light sources 2a and 2c relayed by the illumination relay optical system 6a and 6c enter the light guide fiber 10 from the entrances 12a and 12c, the light intensity distribution of the illumination lights at the vicinity of the entrance side of the fly's eye lens 17a is such that the light intensity in the vicinity of the optical axis is greater than the light intensity outside this portion as shown by the broken line in FIG. 7A. This obtains illumination characteristics in which the light intensity is concentrated at the vicinity of the optical axis.

Figure 7B:
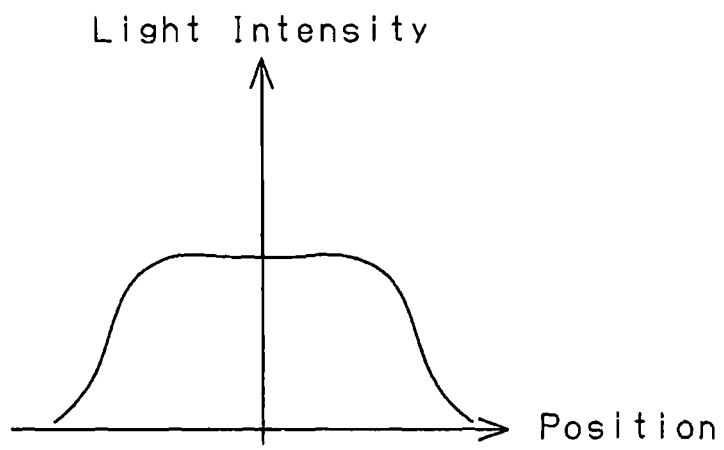

When illumination lights enter the light guide fiber 10 from the entrances 12a, 12b, and 12c, the light intensity distribution of the illumination lights at the vicinity of the entrance side of the fly's eye lens 17a is obtained by combining the light intensity distributions shown by the solid line and the broken line in FIG. 7A. As a result, as shown in FIG. 7B, the light intensity distribution is such that the light intensity in the vicinity of the optical axis and the light intensity outside this portion are substantially the same. The other partial illumination optical systems IL2 to IL7 obtain light intensity distributions that are similar to the partial illumination optical system.

In the illumination apparatus IL, a power supply device 32 supplies the light sources 2a, 2b, and 2c with power, and a control unit 30 may execute control that independently varies the amount of power supplied to each of the light sources 2a, 2b, and 2c. That is, the power supply device 32 and the control unit 30 function as a light intensity ratio adjustment unit. Accordingly, under the control of the control unit 30, the light intensity ratio (light intensity balance) of the illumination light passing through the entrances 12a and 12c relative to the illumination light passing through the entrance 12b may be changed by varying the amount of power supplied to the light sources 2a and 2c and the amount of power supplied to the light source 2b. For example, the intensity of light in the vicinity of the optical axis may be varied to be greater than the intensity of light outside this portion. Alternatively, the intensity of light in the vicinity of the optical axis may be varied to be less than the intensity of light outside this portion. That is, in the manufacturing process, optimization of the light intensity distribution of the illumination light may be required in accordance with the manufacturing process, such as when a high resolution is required or when a high contrast is required. In such a case, such requirements may be satisfied by independently varying the amount of power supplied to each of the light sources 2a, 2b, and 2c and adjusting the light intensity distribution of the illumination light at the vicinity of the fly's eye lens entrance side for each of the partial illumination optical systems IL1 to IL7.

In the exposure apparatus EX, the mask M is illuminated by the illumination apparatus, and scan exposure is performed while synchronously moving the mask M and the plate P relative to the partial projection optical systems PL1 to PL7. This forms a projected image of the pattern formed on the mask M onto the plate P.

As described above, in the illumination apparatus IL according to the present embodiment, the illumination lights from the light sources 2a to 2c are efficiently gathered, and illumination light is emitted by suppressing missing light in accordance with the angle of incidence of the of the light beam of the gathered light. Thus, in the exposure apparatus EX according to the present embodiment, the mask M is illuminated with illumination light, which is a uniformly filled light beam. Thus, in contrast with when illuminating the mask M with illumination light that is in a central part missing state, the projected image of the pattern of the mask M is transferred onto the plate P with high accuracy.

Further, light intensity loss caused by a missing central part of the illumination light from the light sources is somewhat avoided when selecting optimal values or the like for design values such as the size of the illumination relay optical systems and the entrances of the light guide fiber. This increases the illuminance on a mask (plate) in comparison to a normal illumination apparatus.

In the exposure apparatus EX according to the present embodiment, a variable stop mechanism of which at least either one of the aperture diameter and aperture shape is variable may be arranged in the vicinity of the exit side of the fly's eye lens in each of the partial illumination optical systems IL1 to IL7. This allows for control of the illumination conditions for the illumination light corresponding to the partial projection optical systems PL1 to PL7 and ultimately control of the projection conditions (imaging conditions of the projected image) of the mask M.

As the stop mechanism, for example, a revolver mechanism or slider mechanism may be used that enables selective arrangement (switchable arrangement) of a plurality of stops having at least different aperture diameters or different aperture diameters on an optical path of the illumination light. Further, the plurality of stops may include, for example, a first circular aperture having a first aperture diameter for performing normal illumination (conventional illumination), a second circular aperture having a second aperture diameter that is smaller than the first aperture diameter to restrict the numerical aperture (NA) of the illumination light to be smaller than normal illumination so as to perform small a illumination, and an annular aperture having an aperture that is annular (ring-shaped) to perform annular illumination.

In the illumination apparatus IL of the present embodiment, the light intensity distribution of the illumination light in the vicinity of the fly eye's lens entrance side of each of the partial illumination optical systems IL1 to IL7 and the light intensity at the vicinity of the optical axis and the light intensity outside this portion are substantially the same. Thus, the stop mechanism described above suppresses a decrease in the illumination light intensity (i.e., illuminance decrease of the illumination light on the mask M and the substrate P), for example, when switching from normal illumination to small a illumination and when switching from normal illumination to annular illumination. In other words, as shown by the solid line in FIG. 7A, in comparison with the illumination apparatus of the prior art in which the central part of the light intensity distribution is missing, the reduction rate of the illuminance is decreased when stops are switched, and the illuminance during small a illumination and the illuminance during annular illumination are uniformly balanced.

An exposure apparatus according to a second embodiment of the present invention will now be discussed with reference to FIG. 8. The structure of the illumination apparatus in the exposure apparatus according to the first embodiment is changed to the structure shown in FIG. 8. Otherwise, the exposure apparatus according to the second embodiment has the same structure as the exposure apparatus of the first embodiment. Accordingly, in the description of the second embodiment, the components that are the same as the exposure apparatus according to the first embodiment will not be described in detail, and the components that are the same as those of the exposure apparatus according to the first embodiment will be described using the same reference characters as the first embodiment.

Figure 8:
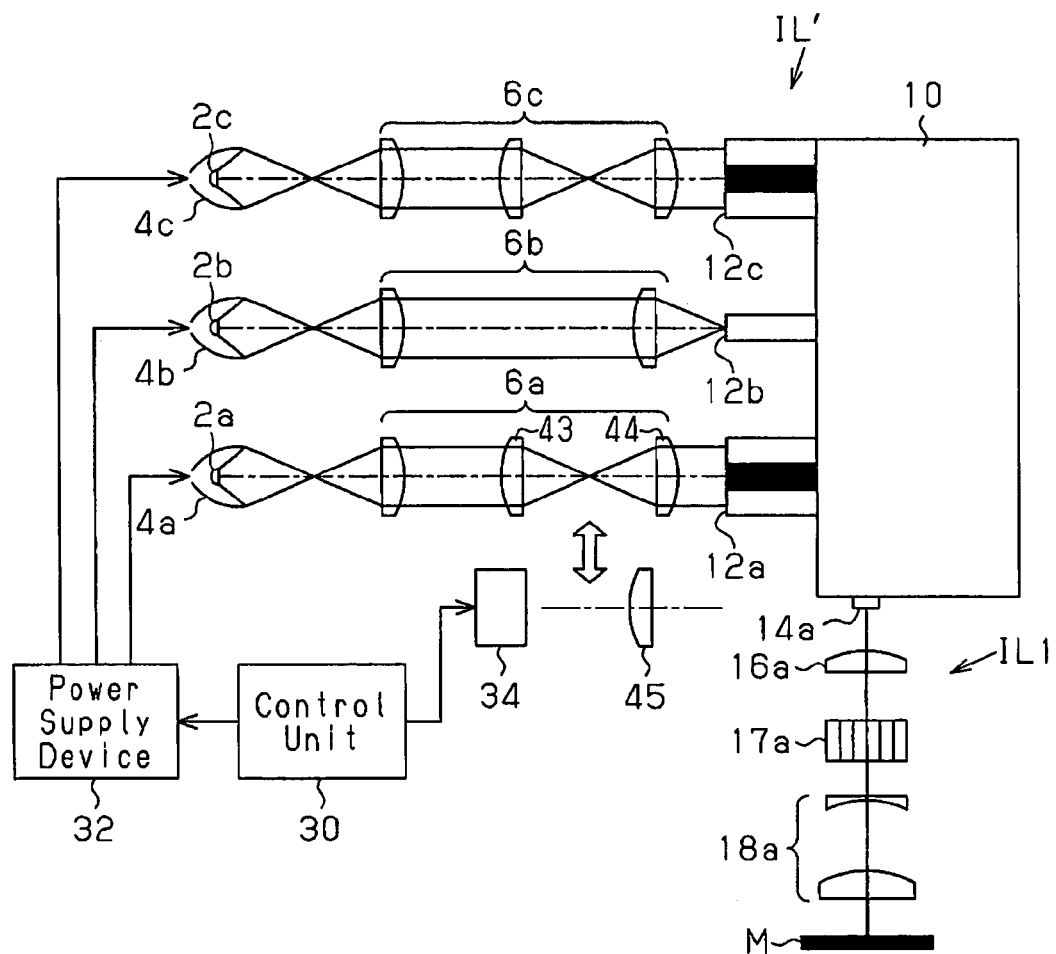
FIG. 8 is a diagram showing the structure of an illumination apparatus according to a second embodiment.

FIG. 8 is a diagram showing the structure of an illumination apparatus IL' according to the second embodiment. In the illumination apparatus IL', the light collecting lens 43 and the second collimating lens 44 in the relay optical system 6a, which relays the illumination light from the light source 2a to the entrance 12a of the light guide fiber 10, are formed to be exchangeable with a light collecting lens 45 by controlling and driving a drive unit 34 with the control unit 30. In other words, the relay optical system 6a may be exchanged with a relay optical system (third relay optical system) that optically relays illumination light from the light source 2a so that the illumination light enters the entrance 12a (first entrance) of the light guide fiber 10 as a first light beam having a first angle of incidence.

Accordingly, in the present embodiment, by exchanging the relay optical system 6a to the third relay optical system, the light intensity distribution may be adjusted at a plane orthogonal to the optical axis of the partial illumination optical system in the vicinity of the fly eye's lens entrance side.

In each of the above embodiments, a multi-lens scanning type exposure apparatus is described. However, in addition to a scanning type exposure apparatus, the present invention may be applied to a step-and-repeat type exposure apparatus that exposes a pattern of the mask M in a state in which the mask M and plate P are still and sequentially step-moves the plate P. Further, the present invention is not limited to a multi-lens exposure apparatus and may be applied to an exposure apparatus including a single projection optical system.

Further, in each of the above embodiments, the light guide fiber 10 has three entrances 12a to 12c but is not limited to three entrances as long as there are a plurality of entrances. Further, the light guide fiber 10 includes one entrance 12b, which is arranged at a position optically conjugated with a light source image, and two entrances 12a and 12c, which are arranged on a pupil plane (Fourier transformation plane) corresponding to the light source image. However, the number of the entrances arranged at a position optically conjugated to the light source image and the number of entrances arranged on a pupil plane corresponding to the light source image may be selected so as to obtain the desired light intensity distribution for the illumination light.

Each of the above embodiments uses the three light sources 2a to 2c as the light source for the illumination apparatus but is only required to include one or more light sources. When there is one light source, the illumination light reflected by the elliptic mirror is divided by an optical system so as to enter an entrance arranged at a position optically conjugated to the optical light source or an entrance arranged on a pupil plane corresponding to the light source. In other words, the light source and the entrance of the light guide fiber do not have to be in a one-to-one correspondence. In this case, the light source, the elliptic mirror, and the optical system that divides the illumination light form a light source unit. Further, the number of fibers at the entrance arranged at a position optically conjugated to the light source image may differ from the number of fibers at the entrance of a pupil plane corresponding to the light source image so that the illumination light emitted from the exit has the desired light intensity ratio.

In the above embodiments, the light guide fiber 10 has seven exits. However, the light guide fiber may have any number of exits as long as there are one or more.

In the above embodiment, under the control of the control unit, a drive unit exchanges some of the lenses of an illumination relay optical system with other lenses. However, some of the lenses of an illumination relay optical system may be manually exchanged with other lenses.

In the above embodiment, a control unit and a power supply device are used as a light intensity adjustment unit to vary the amount of power supplied to each power supply by the power supply device based on the control of the control unit. However, a dark filter or the like may be used as a light intensity adjustment unit to adjust the intensity of the illumination light from each light source. Further, in correspondence (cooperation) with the switching of relay optical systems, the intensity of the illumination light from each light source may be adjusted by the light amount ratio adjustment unit.

A device manufacturing method that uses an exposure apparatus according to the above embodiments will now be discussed. FIG. 9 is a flowchart showing a process for manufacturing semiconductor devices. As illustrated in the chart, in the semiconductor device manufacturing process, a metal film is vapor-deposited onto a wafer, which becomes a substrate for a semiconductor device (step S40). A photoresist, which is a photosensitive material, is applied to the vapor-deposited metal film, to form the plate P (step S42). Then, the exposure apparatus of each embodiment is used to transfer a projected image of a pattern, which is formed in a mask M (reticle), onto each shot region of the wafer (step S44: exposure (illumination and projection)). After the transfer is completed, the wafer is developed. That is, the photoresist onto which a pattern has been transferred is developed (step S46: development). Then, the resist pattern generated on the wafer surface in step S46 is used as a processing mask to perform processing, such as etching, on the wafer surface (step S48: processing).

The resist pattern is a photoresist layer (transfer pattern layer) in which lands and pits are shaped in correspondence with the pattern transferred by the exposure apparatus of each embodiment, with the pits extending through the photoresist layer. In step S48, the wafer surface is processed through the resist pattern. The processing performed in step S48, for example, includes at least either one of etching of the wafer surface and formation of the metal film or the like. In step S44, the exposure apparatus of each embodiment performs pattern transfer using the wafer to which a photoresist is applied as a photosensitive substrate.

FIG. 10 is a flowchart showing a process for manufacturing liquid crystal devices, such as liquid crystal display elements. As illustrated in the chart, in the liquid crystal device manufacturing process, pattern formation (step S50), color filter formation (step S52), cell assembling (step S54), and module assembling (step S56) are sequentially performed.

In the pattern formation of step S50, predetermined patterns such as a circuit pattern and an electrode pattern are formed with the exposure apparatus of each embodiment on a glass substrate to which photoresist is applied so as to serve as the plate. The pattern formation includes exposure, which is for transferring a pattern onto a photoresist layer with the exposure apparatus of each embodiment, development of the plate to which the pattern has been transferred, that is, the development of the photoresist layer (transfer pattern layer) on the glass substrate to generate the photoresist layer shaped in correspondence with the pattern, and processing for processing the surface of the glass substrate through the developed photoresist layer.

In the color filter formation of step S52, a color filter is formed by arranging plural sets of three dots corresponding to R (red), G (green), and B (blue) in a matrix or by arranging plural sets of three strips corresponding to R, G, and B in a horizontal scanning direction.

In the cell assembling of step S54, the glass substrate to which a predetermined pattern has been formed in step S50 and the color filter formed in step S52 are used to assemble a liquid crystal panel (liquid crystal cell). More specifically, for example, liquid crystal is charged into the space between the glass substrate and the color filter to form the liquid crystal panel.

In the module assembling of step S56, various types of components, such as an electrical circuit and backlight for having the liquid crystal panel perform a display operation, is attached to the liquid crystal panel, which has been assembled in step S54.

The application of the present invention is not limited to a semiconductor device or liquid crystal device manufacturing exposure apparatus and may be applied, for example, to an exposure apparatus for a display device such as a plasma display and an exposure apparatus for manufacturing various devices such as an imaging device (CCD etc.), a micro machine, a thin film magnetic head, and a DNA chip. Further, the present invention may be applied to an exposure process (exposure apparatus) when performing photolithography on a mask (photomask, reticle, and the like) to which a mask pattern for various types of devices is formed.

What is claimed is:

1. An illumination apparatus that illuminates an object by illumination light from a light source unit, the illumination apparatus comprising:
    a light transmission unit that includes a plurality of entrances that receive the illumination light from the light source unit and a common exit that emits at least part of the illumination light received by each entrance;
    a first relay optical system that optically relays a first partial illumination light, which is included in the illumination light from the light source unit, to form a first light beam having a first angle of incidence relative to a first optical axis of the first relay optical system and that sends the first light beam into a first entrance, which is included in the plurality of entrances; and
    a second relay optical system that optically relays a second partial illumination light, which is included in the illumination light from the light source unit, to form a second light beam having a second angle of incidence relative to a second optical axis of the second relay optical system and that sends the second light beam into a second entrance, which is included in the plurality of entrances, wherein the first angle of incidence differs from the second angle of incidence.

2. The illumination apparatus according to claim 1, wherein the first angle of incidence is set based on an angle of divergence of the illumination light in a light emitting portion of the light source unit.

3. The illumination apparatus according to claim 1, wherein the first relay optical system projects an image of a light emitting portion of the light source unit into the first entrance.

4. The illumination apparatus according to claim 1, wherein the second angle of incidence is set based on a size of a light emitting portion of the light source unit or a size of an image of the light emitting portion.

5. The illumination apparatus according to claim 4, wherein the second relay optical system sends the second partial illumination light into the second entrance that is arranged on a focal plane of the second relay optical system.

6. The illumination apparatus according to claim 4, wherein the second relay optical system projects a Fourier transformation image corresponding to the light emitting portion into the second entrance.

7. The illumination apparatus according to claim 1, wherein:
the first relay optical system optically relays the illumination light from a first light emitting portion of the light source unit as the first partial illumination light and the second relay optical system optically relays the illumination light from a second light emitting portion of the light source unit as the second partial illumination light, wherein the first light emitting portion differs from the second light emitting portion.

8. The illumination apparatus according to claim 1, wherein:
the light source unit includes a light emitting image formation unit that forms an image of a light emitting portion of the light source unit, and;
the first relay optical system and the second relay optical system each optically relay the illumination light from the image of the light emitting portion.

9. The illumination apparatus according to claim 8, wherein:
the light image formation unit includes an elliptic mirror having a first focal point in the vicinity of the light emitting portion, and
the second entrance is formed to be annular.

10. The illumination apparatus according to claim 1, wherein the first entrance and the second entrance are formed using optical fiber bundles.

11. The illumination apparatus according to claim 1, further comprising:
a third relay optical system that optically relays the second partial illumination light and sends a light beam having the first angle of incidence to the second entrance, wherein the second relay optical system is exchangeable with the third relay optical system.

12. The illumination apparatus according to claim 1, further comprising:
a light intensity adjustment unit that varies a light intensity ratio of the illumination light passing through the first entrance and the illumination light passing through the second entrance that are included in the illumination light emitted from the common exit.

13. The illumination apparatus according to claim 12, wherein the light source unit includes a plurality of light emitting portions associated with the first entrance or the second entrance; and
the light intensity adjustment unit varies a power ratio of power supplied to the light emitting portion associated with the first entrance and power supplied to the light emitting portion associated with the second entrance.

14. The illumination apparatus according to claim 2, wherein the second angle of incidence is set based on a size of the light emitting portion or a size of an image of the light emitting portion.

15. The illumination apparatus according to claim 14, wherein the second relay optical system sends the second partial illumination light into the second entrance that is arranged on a focal plane of the second relay optical system.

16. The illumination apparatus according to claim 3, wherein the second angle of incidence is set based on a size of the light emitting portion or a size of an image of the light emitting portion.

17. The illumination apparatus according to claim 16, wherein the second relay optical system sends the second partial illumination light into the second entrance that is arranged on a focal plane of the second relay optical system.

18. An exposure apparatus comprising:
the illumination apparatus according to claim 1; and
a projection optical system that forms a projected image of a pattern on a mask illuminated by the illumination apparatus onto a photosensitive substrate.

19. An exposure method comprising:
illuminating a pattern on a mask with the illumination apparatus according to claim 1; and
forming a projected image of the pattern illuminated with the illumination apparatus on a photosensitive substrate.

20. A device manufacturing method comprising:
illuminating a pattern on a mask with the illumination apparatus according to claim 1 to perform an exposure for transferring a projected image of the pattern onto a photosensitive substrate;
developing the photosensitive substrate onto which the projected image has been transferred to generate on the photosensitive substrate a transfer pattern layer shaped in correspondence with the projected image; and
processing the photosensitive substrate through the transfer pattern layer.

* * * * *